(12) United States Patent
Kato et al.

(10) Patent No.: US 6,483,098 B1
(45) Date of Patent: Nov. 19, 2002

(54) SIDE-ILLUMINATED TYPE SEMICONDUCTOR PHOTODETECTOR DEVICE AND METHOD OF MANUFACTURING THE SAME

(75) Inventors: Masanobu Kato, Tokyo (JP); Ryozo Furukawa, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/447,437

(22) Filed: Nov. 23, 1999

(30) Foreign Application Priority Data

Dec. 10, 1998 (JP) .......................................... 10-351580

(51) Int. Cl.⁷ .............................................. H01L 31/00
(52) U.S. Cl. .................................. 250/214.1; 250/216

(58) Field of Search ........................ 250/214 LS, 214.1, 250/216, 208.1, 239; 257/80–84, 431–437

(56) References Cited

U.S. PATENT DOCUMENTS 4,772,787 A * 9/1988 Trommer ................ 250/227.11
5,357,103 A * 10/1994 Sasaki .................... 250/227.24

FOREIGN PATENT DOCUMENTS

JP          09307134          11/1997

* cited by examiner

Primary Examiner—Que T. Le
(74) Attorney, Agent, or Firm—Rabin & Berdo, P.C.

(57) ABSTRACT

In a semiconductor photodetector device having a slanting surface, an insulating film is formed over the slating surface as a reflective film under the condition that light is all reflected. Thus, a semiconductor device can be implemented which is high in sensibility and excellent in adhesion.

18 Claims, 10 Drawing Sheets

SIDE-ILLUMINATED TYPE SEMICONDUCTOR PHOTODETECTOR DEVICE AND METHOD OF MANUFACTURING THE SAME

BACKGROUND OF THE INVENTION

1. Field of the Invention

This invention relates to a semiconductor photodetector device, and particularly to a side-illuminated type semiconductor photodetector device suitable for use in surface hybrid integration for 1 $\mu$m-band optical communications.

2. Description of the Related Art

As one of conventional end-face light incidence type semiconductor photodetector devices, there is known one disclosed in Japanese Patent Application Laid-Open No. Hei 9-307134.

In FIG. 3 shown in the above-described publication, an optical module has been disclosed which reflects light incident to an end face of an n type InP substrate 3 from within the atmosphere and propagated through the n type InP substrate 3 by a metal layer 15 (mirror reflective film) having a high reflectance, which is formed over a slanting surface 3A of the n type InP substrate 3, thereby introducing the light into a photodetecting unit or photodetector PD.

Even if, for example, Au relatively high in reflectance is used as the metal layer 15 at an interface between the metal layer 15 and the InP substrate in the above-described publication, the reflectance would become about 0.6 where the wavelength of light is given as 1.3 $\mu$m (corresponding to the wavelength of light normally used in the end-face light incidence type semiconductor photodetector device) and the angle of incidence of the light is given as 55°. At this time, a photoelectric current corresponding to the incident light results in 0.6 A/W and hence sensibility is reduced. Since Au is very poor in adhesion to the InP substrate, it peels off immediately.

When chromium or titanium excellent in adhesion to the InP substrate is used as the metal layer 15, its reflectance is further lowered as compared with Au.

Thus, when the metal layer is used as the mirror reflective film as in the above-described publication, it was not possible to simultaneously satisfy the merits of adhesion and reflectance (in the case of light having the wavelength of 1.3 $\mu$m).

According to the above-described publication, when the InP substrate kept in a wafer state is flawed by a diamond after a V groove has been defined in the InP substrate, and an end face of the InP substrate is formed by cleavage, stress is concentrated on the V groove and hence the InP substrate is cleaved along the V groove, whereby the end face is formed at a position different from the designed position. Further, a chip itself is brittle against stresses applied from the upper surface and back side thereof.

SUMMARY OF THE INVENTION

With the foregoing in view, it is therefore an object of the present invention to provide a semiconductor photodetector device capable of simultaneously satisfying the merits of adhesion and reflectance.

Another object of the present invention is to improve a manufacturing yield of a semiconductor photodetector device wherein a semiconductor substrate with a V groove defined therein is formed by cleavage.

In order to achieve the above objects, there is provided a semiconductor photodetector device according to the present invention, comprising a semiconductor substrate provided with a slanting surface, a material lower in refractive index than the semiconductor substrate, which is formed over the slanting surface as a reflective film, and a photodetecting unit formed over the semiconductor substrate, for reflecting light incident to the semiconductor substrate by the slanting surface and introducing it therein, and wherein the material is an insulating film and the angle of incidence of the light to each of the insulating film having a predetermined refractive index and the slanting surface is set so that the reflection is brought to total reflection.

The present invention further includes various inventions to achieve the above objects.

These inventions will become apparent from the appended claims and the following embodiments.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
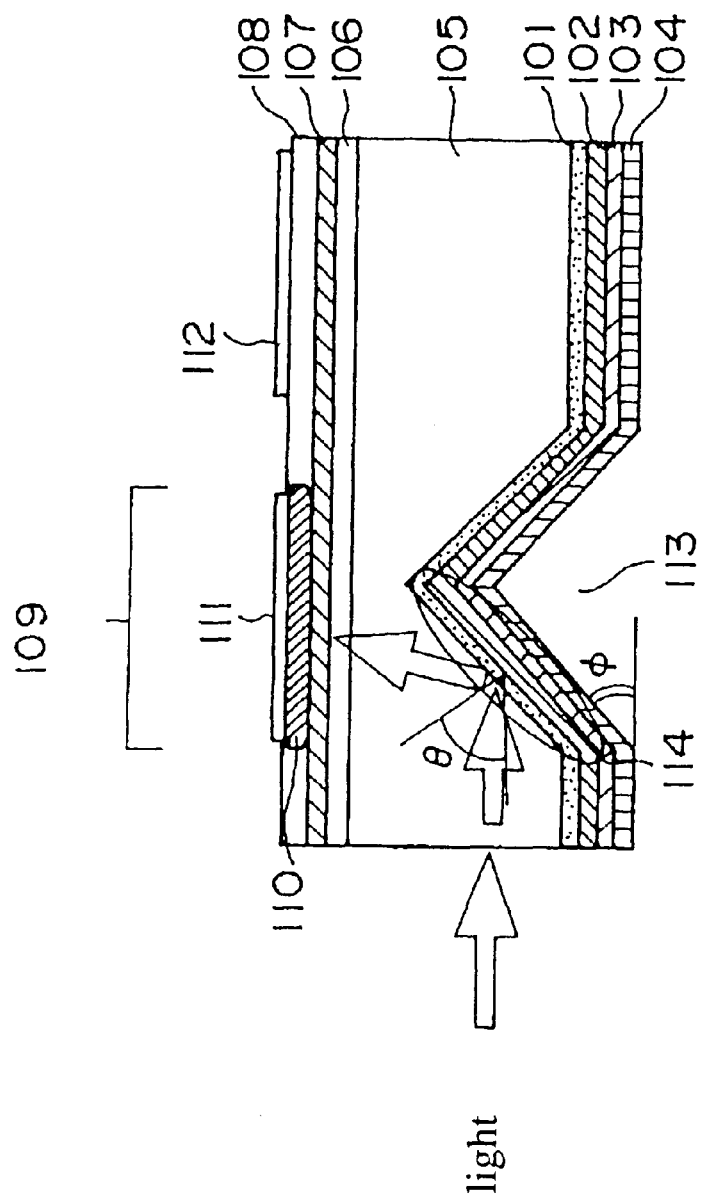
FIG. 1 is a cross-sectional view of a semiconductor photodetector device according to a first embodiment of the present invention.

FIG. 1 is a cross-sectional view of a side-illuminated type semiconductor photodetector device according to a first embodiment of the present invention.

An $n^+$ type InP buffer layer 106, an n type InGaAsP optical absorption layer 107 and an n type InP cap layer 108 are successively formed over an InP substrate 105.

Further, a $P^+$ type InP cap layer 111 is formed in a photodetector region 109 provided within the n type InP cap layer 108 by a preference diffusion method.

A P electrode is formed over the $P^+$ type InP cap layer 111. The P electrode is supplied with a low potential. An n electrode is formed over the n type InP cap layer 108. The n electrode is supplied with a high potential.

Thus, a pin diode is formed between the $n^+$ type InP buffer layer 106, the n type InGaAsP optical absorption layer 107 and a p type InP cap layer 110.

This diode is reversely biased. This diode serves as a photo detector (photodiode) through which current flows due to the incidence of light.

A V groove 113 whose side serves substantially as a mirror surface 114, is formed below the InP substrate 105. The mirror surface 114 is a forward mesa surface of the InP substrate.

The V groove 113 is formed by using an etchant in which HCl and $H_3PO_4$ are mixed in proportions of 1:4.

Consequently, the angle of the groove inclined toward the back surface of the InP substrate 105 results in φ=35°. Thus, the angle of incident of light to the mirror surface 114 would become θ=55°.

A silicon nitride film 101 used as a total reflection mirror film is formed so as to make contact with the mirror surface 114 of the V groove 113.

Further, the silicon nitride film 101 is formed in contact with the back surface of the InP substrate 105 even at portions other than the V groove. Al102, Ti103 and Au104 are successively formed over the silicon nitride film 101.

The Au104 serves as a bonding metal for dies-bonding the semiconductor photodetector device onto the substrate. The silicon nitride film 101 is a film better than the Au104 in adhesion to the InP substrate 105. The Al102 is a film good in adhesion to the siliconnitride film 101. Further, the Ti103 has good adhesion to both the Al102 and Au104.

The operation of the end-face light incidence type semiconductor photodetector device according to the present embodiment will next be explained.

Light incident from an end face of the InP substrate 105 is launched into the silicon nitride film 101 formed in contact with the mirror surface 114 at the incidence angle of θ=55°.

Figure 2:
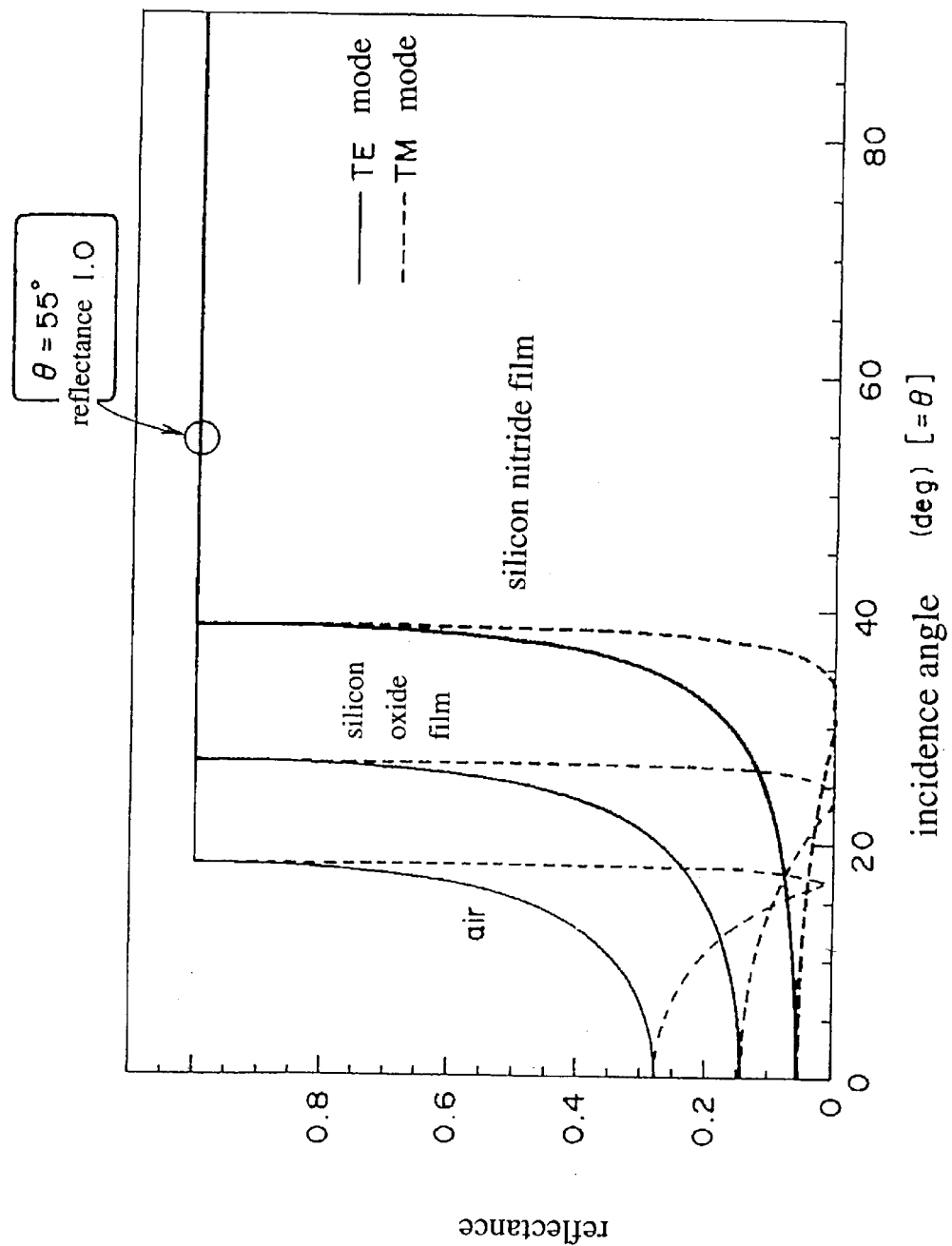
FIG. 2 is a diagram showing reflectance relative to the angle $\theta$ of incidence of light from an InP substrate to respective materials such as a silicon nitride film and a silicon oxide film.

FIG. 2 is a graph showing reflectance relative to the angle θ of incidence of light from within an InP substrate to respective materials such as a silicon oxide film and a silicon nitride film.

Solid lines correspond to lines indicative of reflectances relative to incidence angles of the respective materials in a TE mode. Dotted lines correspond to lines indicative of reflectances relative to incidence angles of the respective materials in a TM mode.

If reflection rate of TE mode differ from TM mode, Polarization dependent loss increases.

The reflectance of the silicon nitride film results in 1 at an incidence angle θ of 40° or more and hence the silicon nitride film is brought into total reflection.

The reflection rate of TE mode equals to TM mode, so this device does not have polarization dependent loss.

Thus, since the light incident at the incidence angle of θ=55° is all reflected and launched into the photo detector, no loss of light occurs in the mirror surface in the first embodiment.

The first embodiment has shown the case in which the InP substrate is used as the semiconductor substrate and the mirror reflective film makes use of the silicon nitride film under the incidence angle of θ=55°. When the incidence angle θ=40° or is greater than 40°, the silicon oxide film may be used as the mirror reflective film as an alternative to the silicon nitride film. Alternatively, the mirror surface 114 may directly be exposed to the atmosphere without having to use the mirror reflective film and define anything in the V groove.

When the silicon oxide film is used as the total reflective mirror film, the incidence angle θ=30° or maybe greater than 30°. IN case of using an etchant in which $HBr:H_2O_2:H_2O=$ 1:1:3, the angle of the froove inclined toward the back surface of the InP substrate 105 results in φ=55°. Thus the angle of incident of light to the mirror surface would become θ=35°.

However, when the mirror surface is directly exposed to the air and nothing is formed in the mirror surface, solder might adhere to the mirror surface when the semiconductor photodetector device is dies-bonded onto the substrate in a subsequent process. Since there is a possibility that the reflectance will be reduced in this case, it is necessary to adopt the construction of each embodiment to be described later.

The silicon nitride film and the silicon oxide film are respectively films low in reflectance with respect to the InP substrate and excellent in adhesion to the InP substrate. The silicon nitride film and the silicon oxide film are films which no absorb light when the wavelength of incident light ranges from 1.3 μm to 1.625 μm.

Figure 3:
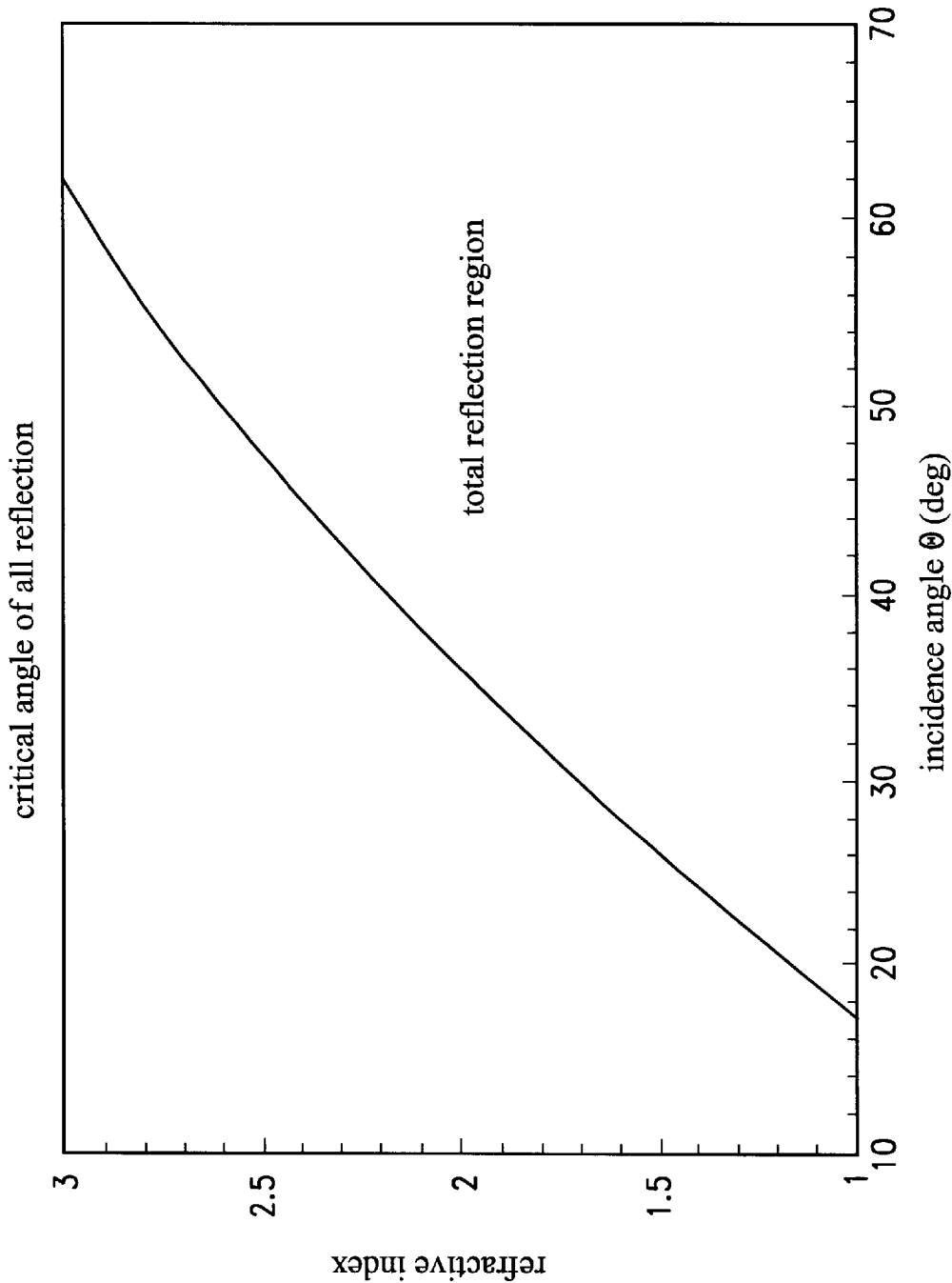
FIG. 3 is a diagram illustrating a refractive index of a material X relative to the angle of incidence where light incident from within the InP substrate to the material X corresponding to a mirror reflective film is fully reflected.

FIG. 3 is a graph illustrating a refractive index of a material X relative to the angle of incidence where light incident from within the InP substrate to the material X corresponding to a mirror reflective film is fully reflected.

A region on the right side as viewed from a line described in the graph corresponds to a region in which light is all reflected.

If an insulating film used as a mirror reflective film having a light incidence angle (corresponding to the angle of the groove inclined toward the back surface of the InP substrate) and predetermined reflectance is suitably set so as to fit to total reflection conditions as shown in FIG. 3 in the semiconductor photodetector device according to the first embodiment, then a semiconductor photodetector device can be implemented which provides a less reduction in its sensibility and is excellent in adhesion to the InP substrate.

Figure 6:
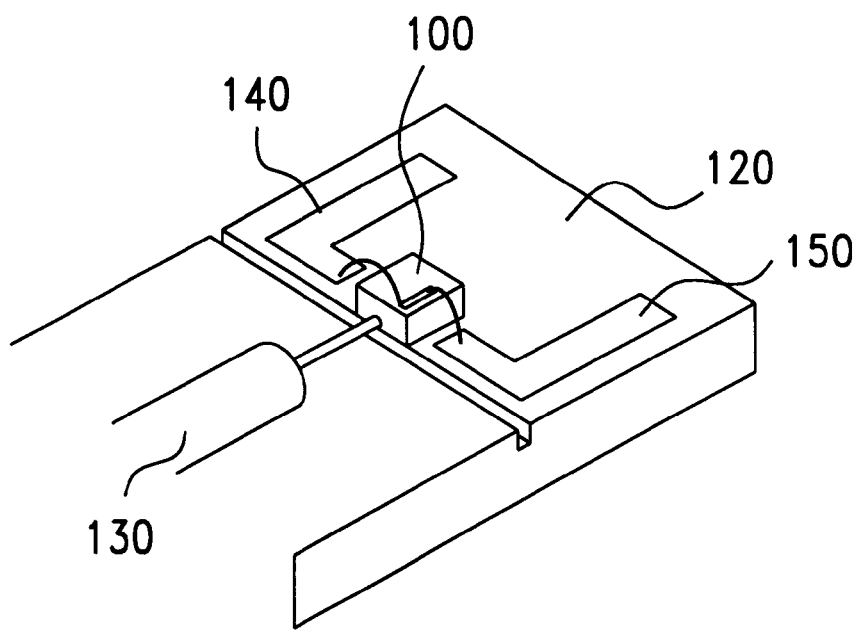
FIG. 6 is a diagram showing a state in which a semiconductor photodetector device 100 according to the first embodiment of the present invention is implemented on a silicon substrate 120.

FIG. 6 is a diagram showing a state in which a semiconductor photodetector device 100 according to the first embodiment of the present invention is implemented on a silicon substrate 120.

Reference numerals 140 and 150 indicate electrode patterns respectively. The electrode patterns 140 and 150 are respectively electrically connected to a p electrode 111 and an n electrode 112 of the semiconductor photodetector device 100. The p electrode 111 and n electrode 112 are supplied with potentials through the electrode patterns 140 and 150 respectively. Further, a single mode fiber 130 is implemented on the silicon substrate 120. Light from the single mode fiber 130 is launched into an end face of the semiconductor photodetector device 100.

Figure 4:
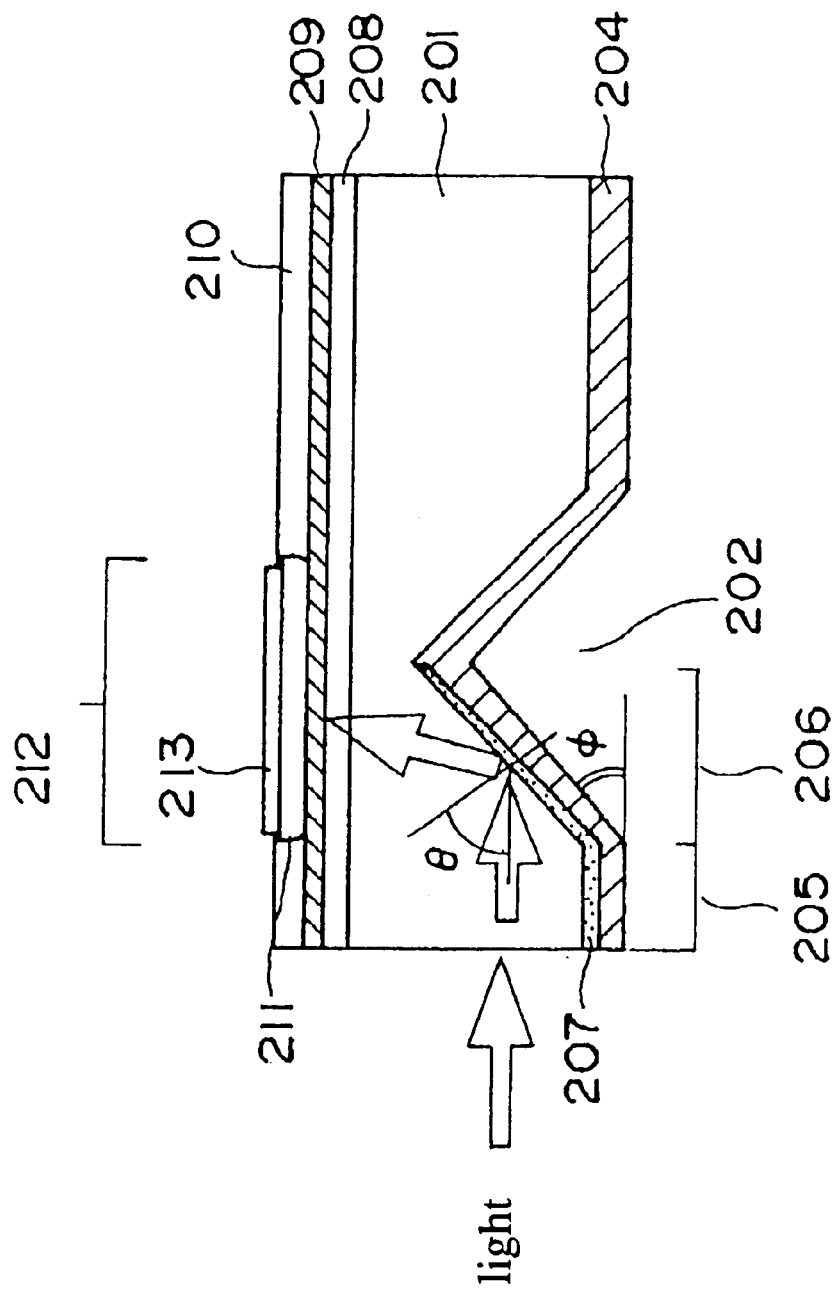
FIG. 4 is a cross-sectional view of a side-illuminated type semiconductor photodetector device according to a second embodiment of the present invention.

FIG. 4 is a cross-sectional view of a side-illuminated type semiconductor photodetector device according to a second embodiment of the present invention.

An $n^+$ type InP buffer layer 208, an n type InGaAsP optical absorption layer 209 and an n type InP cap layer 210 are successively formed over an InP substrate 201.

Further, a $P^+$ type InP cap layer 211 is formed in a photodetector region 212 provided within the n type InP cap layer 210 by the preference diffusion method.

A P electrode is formed over the $P^+$ type InP cap layer 211. The P electrode is supplied with a low potential.

A V groove 202 similar to that provided in the first embodiment is defined below the InP substrate 201. The V groove is formed by using an etchant in which HCl and $H_3PO_4$ are mixed in proportions of 1:4.

Consequently, the angle of the groove with respect to the back surface of the InP substrate 201 results in $\phi=35°$. Thus, the angle of incident of light to a mirror surface would become $\theta=55°$. A silicon nitride film 207 used as a mirror reflective film is formed over the back surface of the InP substrate 201, corresponding to a mirror reflecting region 206 in which a mirror surface of the groove 202 is formed and an optical waveguiding region 205 in which light incident from the end face of the semiconductor photodetector device travels.

AuGeNi, Au, Cr and Au are successively formed over the silicon nitride film 207 and the back surface of the InP substrate 201, which is exposed without being covered with the silicon nitride film 207. A complex film 204 (constructed with a film composed of AuGeNi, Au, Cr and Au as the complex film) is supplied with a high potential and is constructed as an n electrode of a pin diode. In the present embodiment, AuGeNi and Au have been alloyed.

Figure 5:
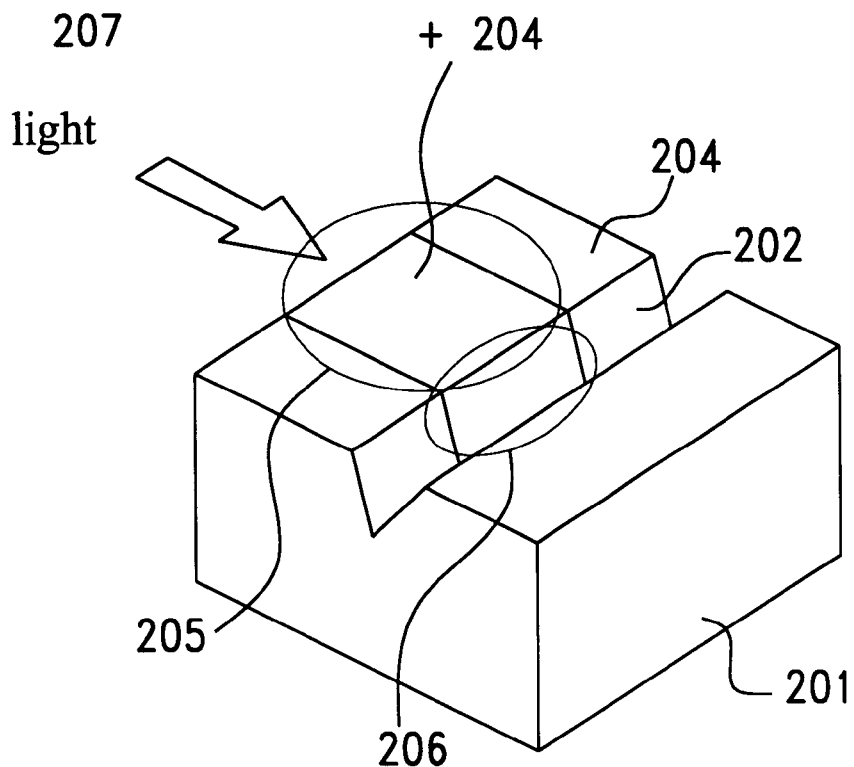
FIG. 5 is a perspective view of the semiconductor photodetector device shown in FIG. 4 as viewed from the direction of the back surface thereof.

FIG. 5 is a perspective view of the semiconductor photodetector device according to the second embodiment as viewed from the direction of the back surface thereof. The silicon nitride film 207 and the complex film 204 are successively formed over the back surface of the InP substrate 201, which corresponds to the optical waveguiding region 205 and the mirror reflecting region 206. The complex film 204 is directly formed over the back surface of the InP substrate 201, which is other than both regions.

Since the silicon nitride film is formed only in the regions (corresponding to the optical waveguiding region and the mirror reflecting region) through which light passes and AuGeNi used as an ohmic metal is directly connected to the back surface of the InP substrate in the second embodiment, this can be utilized as an electrode.

In the second embodiment, the angle of incidence of light has been set to 55° and the silicon nitride film has been adopted as the mirror reflective film. If an insulating film used as a mirror reflective film having a light incidence angle (corresponding to the angle of the groove inclined toward the back surface of the InP substrate) and predetermined reflectance is suitably set so as to fit to total reflection conditions in a manner similar to the first embodiment even in the case of the second embodiment, then a semiconductor photodetector device can be implemented which provides a less reduction in sensibility and is excellent in adhesion to the InP substrate.

Figure 7:
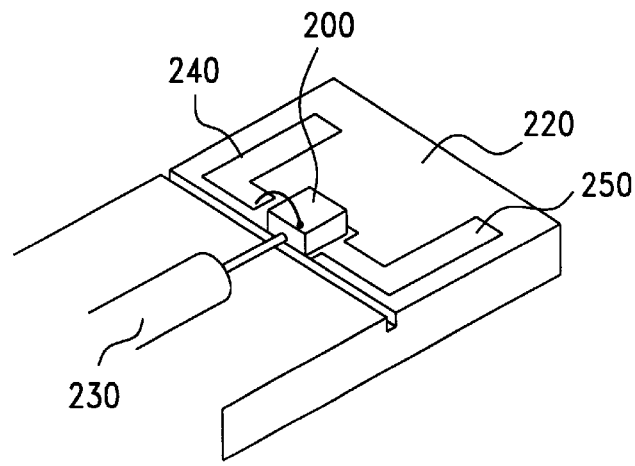
FIG. 7 is a diagram illustrating a state in which a semiconductor photodetector device 200 according to the second embodiment of the present invention is implemented on a silicon substrate 220.

FIG. 7 a diagram illustrating a state in which a semiconductor photodetector device 200 according to the second embodiment is implemented on a silicon substrate 220.

Reference numerals 240 and 250 indicate electrode patterns respectively. The electrode patterns 240 and 250 are electrically connected to their corresponding p electrode 213 and n electrode 214 of the semiconductor photodetector device 200. Further, a single mode fiber 230 is implemented on the silicon substrate 220. Light from the single mode fiber 230 launched into an end face of the semiconductor photodetector device 200.

Figure 8:
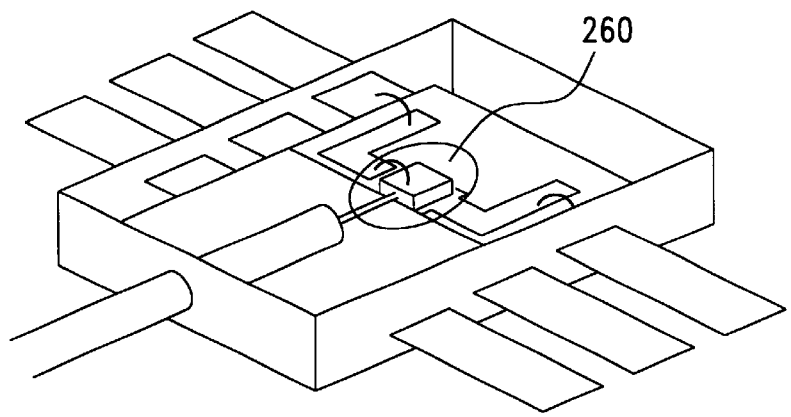
FIG. 8 is a diagram showing a surface hybrid integration module equipped with a semiconductor photodetector device according to the present invention.

FIG. 8 is a diagram showing a plane-mounted module equipped with a semiconductor photodetector device according to the present invention.

In the plane-mounted module, the silicon substrate shown in FIG. 7 on which the semiconductor photodetector device according to the second embodiment is mounted, is sealed with an epoxy resin 260.

The second embodiment is constructed in such a manner that the electrodes are formed over the back surface of the InP substrate and the semiconductor photodetector device is implemented on the silicon substrate by connecting the electrode formed over the back surface of the InP substrate to its corresponding electrode pattern 214 formed over the silicon substrate 220 by solder or the like. Thus, since the number of wire bonding process steps may be reduced in the semiconductor photodetector device according to the second embodiment as compared with the semiconductor photodetector device according to the first embodiment, mounting costs can be reduced. Further, since the change that the breaking of a wire might occur is reduced because wire is few in number, a plane-mounted module having a high degree of reliability can be implemented.

Figure 9:
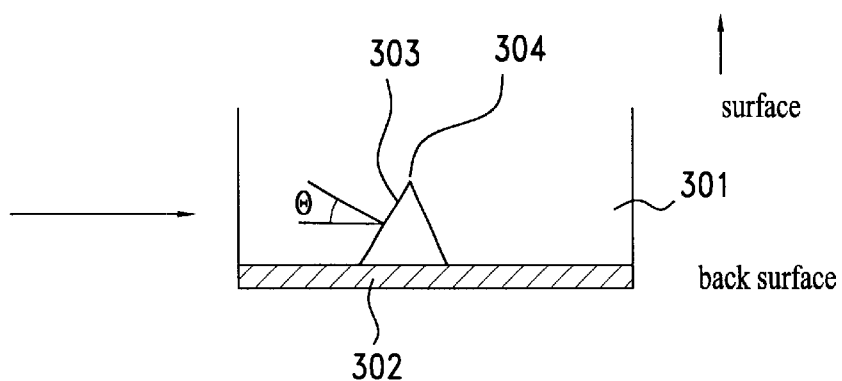
FIG. 9 is a fragmentary cross-sectional view of a side-illuminated type semiconductor photodetector device according to a third embodiment of the present invention.

FIG. 9 is a fragmentary cross-sectional view of a side-illuminated type semiconductor photodetector device according to a third embodiment of the present invention.

In a manner similar to the semiconductor photodetector device according to the first embodiment, an $n^+$ type InP buffer layer, an n type InGaAsP optical absorption layer and an n type InP cap layer unillustrated in the drawing are successively formed over an InP substrate 301. A $P^+$ type InP cap layer is formed in a photodetector region provided within the n type InP cap layer.

A P electrode is formed over the $P^+$ type InP cap layer. The P electrode is supplied with a low potential. An n electrode is formed over the n type InP cap layer. The n electrode is supplied with a high potential.

On the other hand, a V groove 304 is defined below the InP substrate 301. Polyimide 303, which is a material low in refractive index with respect to the InP substrate, is embedded in the V groove 304. Here, the refractive index of the InP substrate is 3.21 and the refractive index of the polyimide is 1.7. The polyimide 303 embedded in the V groove is used as a mirror reflective film. The angle of a mirror surface in the V groove toward the InP substrate 301 is set so that light traveling through the InP substrate 301 is all reflected by a slanting surface of the V groove 304.

Since the refractive index of the polyimide is given as 1.7, the light is fully reflected if the angle of incidence of light to the polyimide 303 is given as $\theta=30°$ or more. Therefore, the angle of the mirror surface of the V groove with respect to the back surface of the InP substrate 301 may be $\phi=60°$ or less. Further, a bonding metal 302 to be mounted on an unillustrated substrate is formed over the back surface of the InP substrate 301 and the polyimide 303.

In the semiconductor photodetector device according to the present embodiment, when the InP substrate is in a wafer state, the polyimide 303 is embedded in the V groove defined in the InP substrate 301 and the bonding metal 302 is formed over the polyimide 303 and the back surface of the InP substrate 301. Thereafter, the InP substrate is divided into chips by cleavage.

Thus, the embedding of the polyimide into the V groove makes it possible to avoid the concentration of stress on the V groove upon cleavage. Accordingly, the problem that the InP substrate will break along the V groove, can be avoided so that the end surface of the InP substrate can be formed as designed.

The semiconductor photodetector device according to the present embodiment is constructed so that the polyimide is used as the film to be embedded in the V groove, the angle of incidence of light to the polyimide is set to $\theta=30°$ or more, and the light is all reflected by the mirror surface of the V groove. If consideration is given to only the fact that the light is simply reflected by the mirror surface of the V groove and the InP substrate is prevented from breaking, then films other than the polyimide may be used so long as a material lower in refractive index than the InP substrate is adopted.

Figure 10:
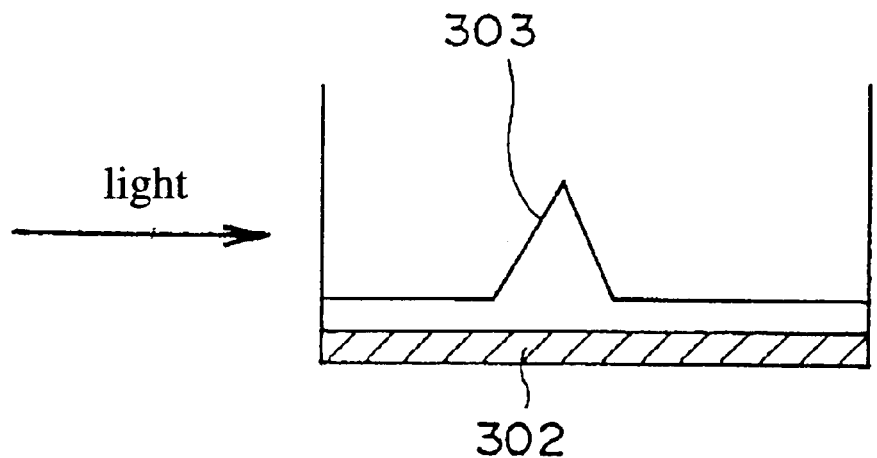
FIG. 10 is a fragmentary cross-sectional view of a side-illuminated type semiconductor photodetector device according to a fourth embodiment of the present invention.

FIG. 10 is a fragmentary cross-sectional view of a side-illuminated type semiconductor photodetector device according to a fourth embodiment of the present invention.

Elements of structure identical or corresponding to those employed in the semiconductor photodetector device according to the third embodiment are identified by the same reference numerals.

In the semiconductor photodetector device according to the present embodiment, polyimide 303 is embedded in a V groove 304 and formed in contact with the back surface of an InP substrate 301 other than the V groove. Further, a bonding metal 302 is formed over the polyimide 303.

With the exception of it, the present embodiment is identical to the semiconductor photodetector device according to the third embodiment in configuration and manufacturing method for forming polyimide and a boning metal and thereafter dividing an InP substrate into chips.

In the present embodiment, the polyimide 303 is formed over the back surface of an InP substrate 301 corresponding to a traveling region of light incident to the InP substrate 301 even when the light incident from the back surface of the InP substrate 301 to an end face of the InP substrate 301 is low in position, in addition to the effect of the third embodiment. Therefore, the light incident from the end surface of the InP substrate is not emitted outside from the back surface of the InP substrate before the light falls on a mirror surface of the V groove 304.

Namely, since the light is reflected by the polyimide 303 formed over the back surface of the InP substrate 301, highly sensitive light-reception is implemented.

Figure 11:
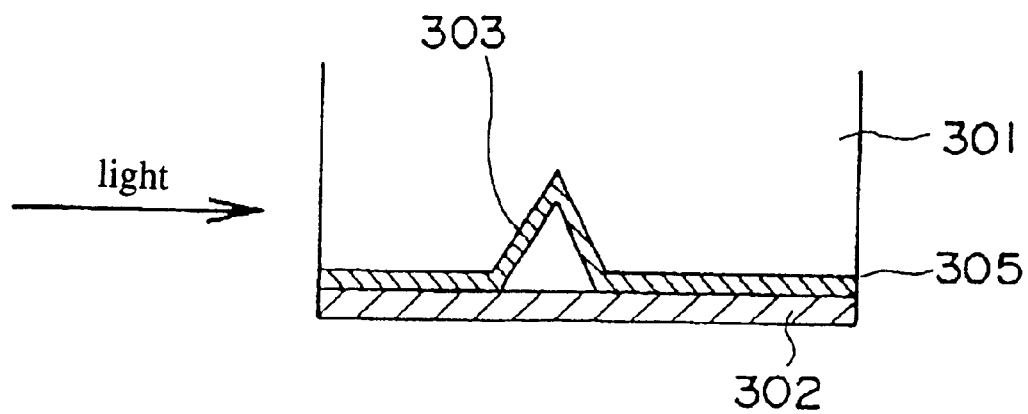
FIG. 11 is a fragmentary cross-sectional view of a side-illuminated type semiconductor photodetector device according to a fifth embodiment of the present invention.

FIG. 11 is a fragmentary cross-sectional view of a side-illuminated type semiconductor photodetector device according to a fifth embodiment of the present invention.

Elements of structure identical or corresponding to those employed in the semiconductor photodetector device according to the third embodiment are identified by the same reference numerals.

In the present embodiment, a film 305 composed of $SiO_2$, SiNx or $Al_2O_3$ or the like, which is of a film lower in refractive index than an InP substrate 301, is formed at an interface between polyimide 303 and the InP substrate 301. At this time, light incident to the InP substrate 301 is set to such an incidence angle that the light is fully reflected by a mirror surface of a V groove 304.

Further, the film 305 composed of $SiO_2$, SiNx or $Al_2O_3$ or the like, which is lower in refractive index than the InP substrate, is formed at an interface between a bonding metal 302 and the back surface of the InP substrate 301.

Since a material other than resin and lower in refractive index than the InP substrate is utilized as a mirror refractive film in the present embodiment, the refractive index thereof is held uniform as compared with resin changed in refractive index due to heat and moisture as well as the effects of the third and fourth embodiments. Therefore, a semiconductor photodetector device can be implemented which is capable of achieving a further improvement in sensitivity.

Figure 12:
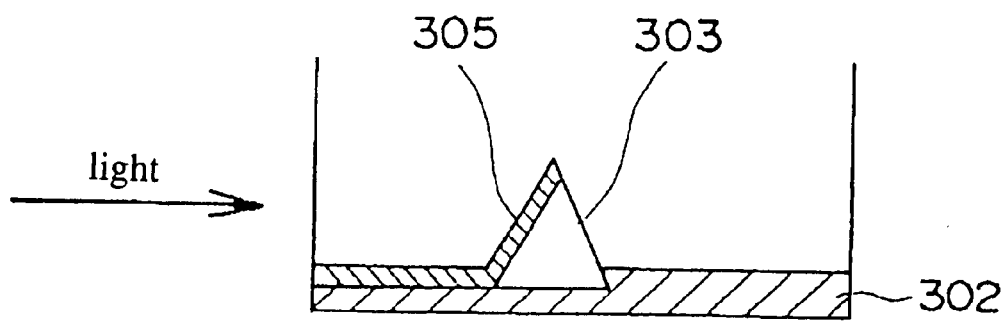
FIG. 12 is a fragmentary cross-sectional view of a side-illuminated type semiconductor photodetector device according to a sixth embodiment of the present invention.

FIG. 12 is a cross-sectional view of a side-illuminated type semiconductor photodetector device according to a sixth embodiment of the present invention.

Elements of structure identical or corresponding to those employed in the semiconductor photodetector device according to the fifth embodiment are identified by the same reference numerals.

In the present embodiment, a film 305 composed of $SiO_2$, SiNx or $Al_2O_3$ or the like is not formed except for a back surface of an InP substrate and a slanting surface of a V groove in optical waveguiding region. Further, a bonding metal 302 is kept in direct contact with the InP substrate in a region other than the above-described region.

Thus, the present embodiment can obtain a semiconductor photodetector device high in adhesion between the InP substrate 301 and the bonding metal 302 in addition to the effects of the third through fifth embodiments.

Figure 13:
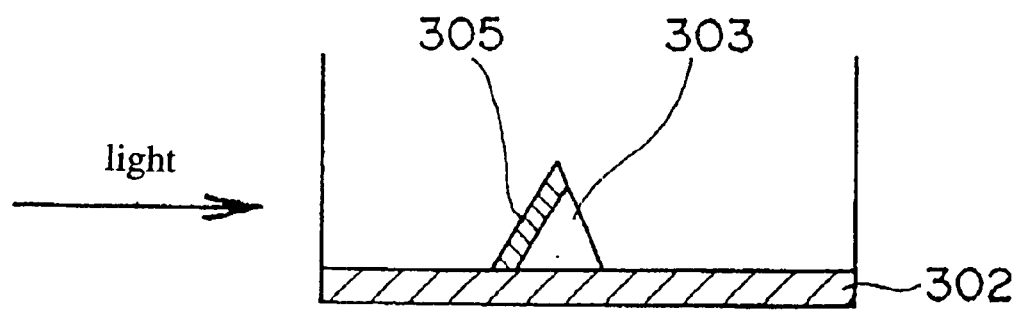
FIG. 13 is a fragmentary cross-sectional view of a side-illuminated type semiconductor photodetector device according to a seventh embodiment of the present invention.

FIG. 13 is a fragmentary cross-sectional view of a side-illuminated type semiconductor photodetector device according to a seventh embodiment of the present invention.

Elements of structure identical or corresponding to those employed in the semiconductor photodetector device according to the sixth embodiment are identified by the same reference numerals.

In the present embodiment, a film 305 is formed only over a slanting surface of a V groove and a bonding metal is directly connected to the back of an InP substrate other than the groove. Therefore, a semiconductor photodetector device can be obtained which is higher than the sixth embodiment in adhesion between the bonding metal and the InP substrate.

In the semiconductor photodetector devices according to the embodiments shown in FIGS. 11 through 13, the InP substrates are divided into chips after the films 305, polyimide 303 and bonding metals 303 are formed in wafer states, respectively.

Figure 14:
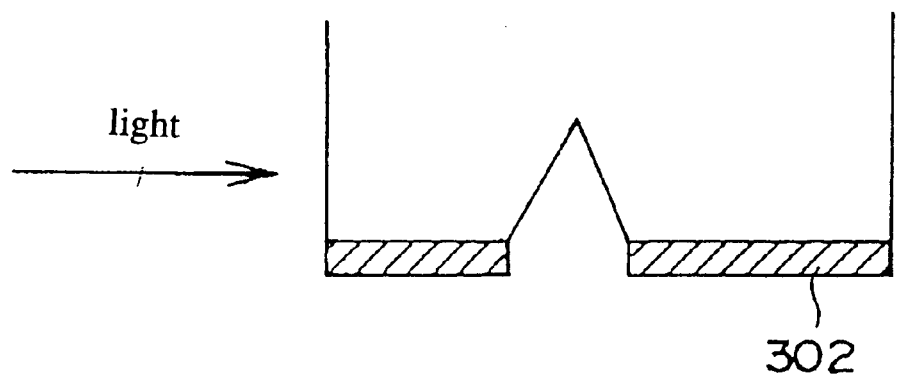
FIG. 14 is a fragmentary cross-sectional view of a side-illuminated type semiconductor photodetector device according to an eighth embodiment of the present invention.

FIG. 14 is a cross-sectional view of a side-illuminated type semiconductor photodetector device according to an eighth embodiment of the present invention.

In the semiconductor photodetector device according to the eighth embodiment, nothing is formed in a V groove and the V groove is directly exposed to the atmosphere.

In the present embodiment, light is all reflected by an interface between an InP substrate 301 and the air. A bonding metal is formed over the back surface of the InP substrate except for the V groove.

Since a gas like the air is uniform in refractive index, highly sensitive light-reception is made possible.

Figure 15:
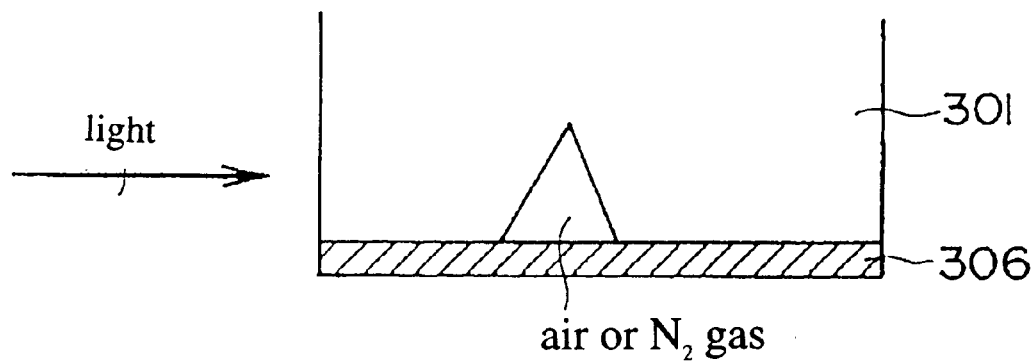
FIG. 15 is a fragmentary cross-sectional view of a side-illuminated type semiconductor photodetector device according to a ninth embodiment of the present invention.

FIG. 15 is a cross-sectional view of a side-illuminated type semiconductor photodetector device according to a ninth embodiment of the present invention.

In the semiconductor photodetector device according to the ninth embodiment, a V groove 304 is sealed with a metal plate 302 and filled with a gas such as the air or nitrogen gas.

In the present embodiment, a groove is defined under the condition that light is all reflected by an interface between an InP substrate and the air.

Since the gas is uniform in refractive index, highly sensitive light-reception is made possible where a material such as polyimide is utilized as a mirror reflective film.

Since solder or the like does not adhere to the V groove upon implementation of the semiconductor photodetector device on the substrate because the interior of the V groove is covered with the metal plate, no reflectance is lowered.

Figure 16:
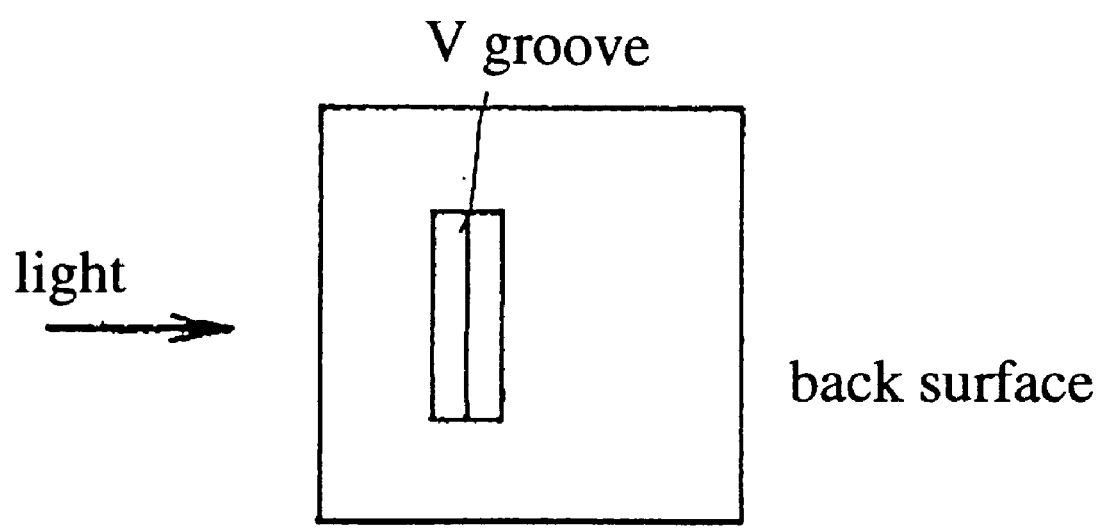
FIG. 16 is a plan view illustrating the back surface of the end-face light incidence type semiconductor photodetector device according to each of the embodiments.

FIG. 16 is a plan view showing the back surface of the end-face light incidence type semiconductor photodetector device according to each of the aforementioned embodiments.

As shown in this drawing, the V groove employed in each embodiment is defined in a partial region of a chip for a semiconductor photodetector device and no groove is defined in the end of the chip.

Consequently, a resist can be prevented from flowing out upon application of the resist at the execution of photolithography for the purpose of forming a bonding metal and electrodes.

Thus, since the resist can be uniformly applied, the back side electrodes and the bonding metal can be formed with satisfactory accuracy.

A mixed liquid of HBr, $H_2O_2$ and $H_2O$ can be used as an etchant used upon definition of the V grooves in the respective embodiments referred to above. The proportion of mixture a thereof is defined as $HBR:H_2O_2:H_2O=1:1:3$. Further, a mixed liquid of Br and $CH_3OH$ can be used. The proportion of mixture of BR and $CH_3OH$ is given as Br of 25 g and $CH_3OH$ of 500 cc.

Owing to the execution of anisotropic etching using the etchant, the angle of the forward mesa surface of the V groove with respect to the back surface of the InP substrate can be set to $\phi=54°$. The incidence angle of light can be set to $\theta=36°$.

Figure 17:
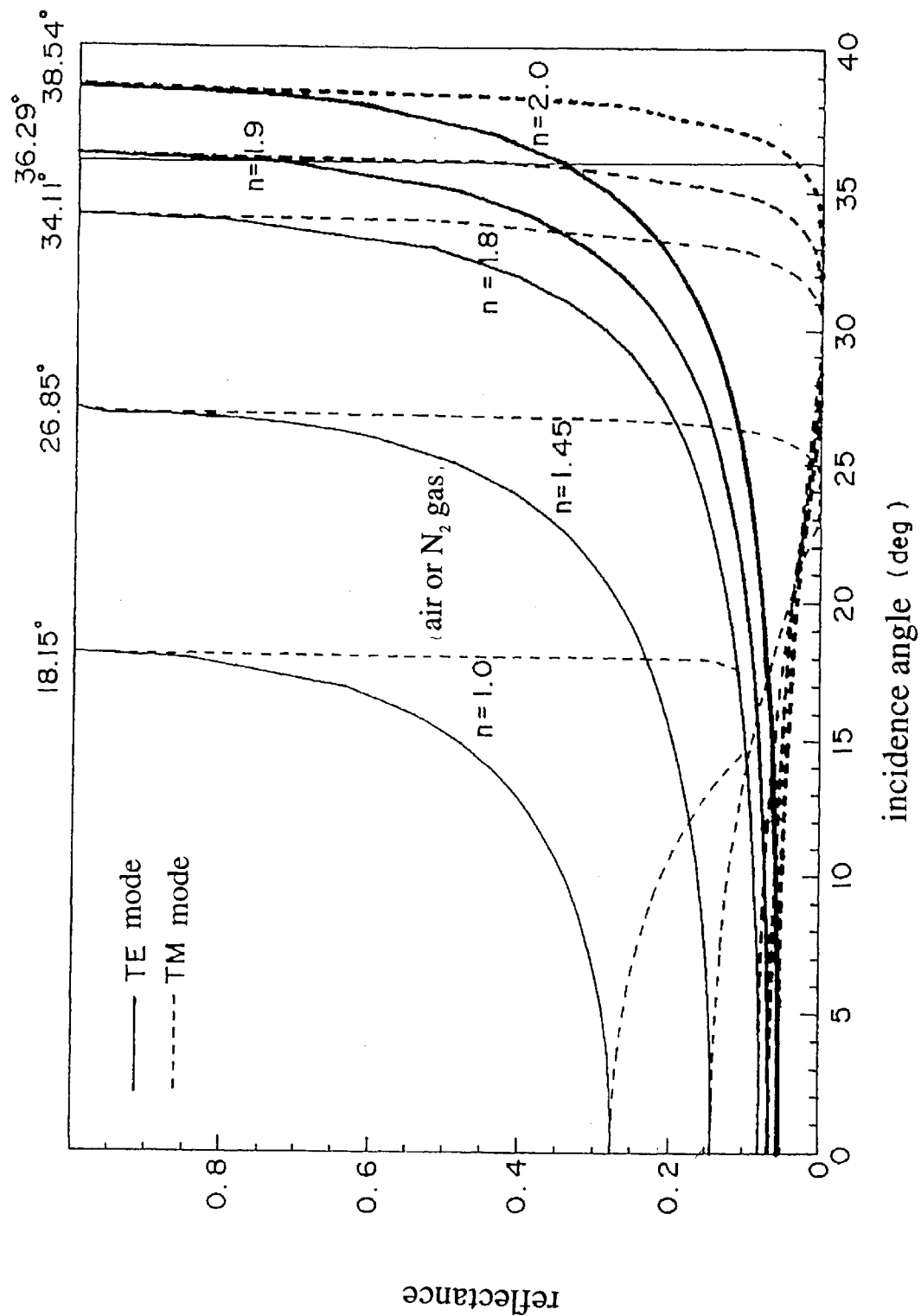
FIG. 17 is a diagram showing reflectance relative to the angle of incidence of light where the light incident from within an InP substrate to a material X having a refractive index n, which is used as a mirror reflective film, is reflected.

FIG. 17 is a graph showing reflectance relative to the angle of incidence of light where the light incident from within an InP substrate to a material X having a refractive index n, which is used as a mirror-reflective film, is reflected.

When the incidence angle of light is now set greater than $\theta=36.29°$, it is understood that light is all reflected by forming a material having a refractive index of 1.9 or less over a slanting surface of a V groove.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. The semiconductor photodetector device, comprising:
    a semiconductor substrate having a slanting surface;
    an insulating film formed on and adhering to the slanting surface, the insulating film being lower in refractive index a said semiconductor substrate; and;
    a photodetecting unit into which light incident to said semiconductor substrate and reflected from said slanting surface is launched, said photodetecting unit being formed on said semiconductor substrate;
    wherein said insulating film is set to a predetermined refractive index and the I, angle of incidence of the light toward said slanting surface is set so that the reflection from said slanting surface is a total reflection within said semiconductor substrate.

2. The semiconductor photodetector device according to claim 1, wherein said photodetecting unit is formed on a first main surface of said semiconductor substrate, and wherein said photodetecting unit has a first electrode supplied with a first predetermined potential formed on said photodetecting unit on the first main surface of said semiconductor substrate, and a second electrode supplied with a second predetermined potential formed on the second main surface of said semiconductor substrate.

3. The semiconductor photodetector device according to claim 1, wherein said insulating film is a silicon nitride film or a silicon oxide film and the angle of incidence of the light is greater than or equal to 40°.

4. The semiconductor photodetector device according to claim 1, wherein said insulating film has a refractive index less than or equal to 1.9 and an incidence angle greater than or equal to 36.29°.

5. The semiconductor photodetector according to claim 1, wherein said insulating film is a silicon oxide film and the angle of incidence of the light is greater than or equal to 36.29°.

6. The semiconductor photodetector device according to claim 1 wherein said semiconductor substrate is an InP substrate.

7. A semiconductor photodetector device, comprising:
    a semiconductor substrate having a groove defined in a back surface thereof;
    a photodetecting unit into which light incident to said semiconductor substrate and reflected by a sidewall of said groove is launched, said photodetecting unit being formed on a front surface of said semiconductor substrate; and
    a first material having a lower refractive index than said semiconductor substrate, formed within said groove, and formed over the back surface of said semiconductor substrate so as to prevent emission of said incident light from said back surface.

8. A semiconductor photodetector device, comprising:
    a semiconductor substrate having a groove defined in a back surface thereof;
    a photodetecting unit into which light incident to said semiconductor substrate and reflected by a sidewall of said groove is launched, said photodetecting unit being formed on a front surface of said semiconductor substrate;

a first material formed within said groove, said first material being a resin having a lower refractive index than said semiconductor substrate; and a second material other than the resin, which is lower in refractive index a said semiconductor substrate, and is formed between the sidewall of said groove and said first material so as to make direct contact with the sidewall of said groove.

9. The semiconductor photodetector device according to claim 8, wherein said second material is formed in contact with the back surface of said semiconductor substrate.

10. The semiconductor photodetector devise according to claim 7, wherein a bonding metal is formed over the surface of said first material formed on the back of said semiconductor substrate.

11. The semiconductor photodetector device according to claim 8, wherein a bonding metal is formed in contact with the back surface of said semiconductor substrate, so as to make contact with said semiconductor substrate.

12. The semiconductor photodetector device according to claim 7, wherein said groove is undefined in an end of said semiconductor substrate.

13. The semiconductor photodetector device according to claim 8, wherein said second material is a silicon nitride film, a silicon oxide film or $Al_2O_3$.

14. The semiconductor photodetector device according to claim 8, wherein said second material has a refractive index less than or equal to 1.9 and a light incidence angle greater than or equal to 36.29°.

15. The semiconductor photodetector device according to claim 8, wherein said second material has a predetermined refractive index and the incidence angle of light with respect to the sidewall of said groove is set so that the reflection from said side wall is a total reflection within said semiconductor substrate.

16. The semiconductor photodetector device according to claim 7, wherein said semiconductor substrate is an lnP substrate.

17. The semiconductor photodetector device according to claim 8, wherein said semiconductor substrate is an lnP substrate.

18. A semiconductor photodetector device which has a semiconductor substrate having a groove defined in a back surface thereof and allows light incident to said semiconductor substrate to be reflected by a slanting surface of said groove, thereby introducing the light into a photodetector unit formed on a front surface of said semiconductor substrate, comprising:

a metal plate formed over said back surface including said groove;

wherein gas is filled between said groove and said metal plate, and said metal plate forms an electrode of said photodetector unit.

* * * * *